(12) United States Patent
Jacke et al.

(10) Patent No.: US 11,164,971 B2
(45) Date of Patent: Nov. 2, 2021

(54) VERTICAL SIC MOSFET

(71) Applicant: Robert Bosch GmbH, Stuttgart (DE)

(72) Inventors: Thomas Jacke, Tuebingen (DE);
Wolfgang Feiler, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 412 days.

(21) Appl. No.: 16/086,212

(22) PCT Filed: Jan. 30, 2017

(86) PCT No.: PCT/EP2017/051895
§ 371 (c)(1),
(2) Date: Sep. 18, 2018

(87) PCT Pub. No.: WO2017/167469
PCT Pub. Date: Oct. 5, 2017

(65) Prior Publication Data
US 2020/0295186 A1    Sep. 17, 2020

(30) Foreign Application Priority Data

Mar. 31, 2016 (DE) .......................... 102016205331.0

(51) Int. Cl.
*H01L 29/76* (2006.01)
*H01L 29/78* (2006.01)
(Continued)

(52) U.S. Cl.
CPC ...... *H01L 29/7827* (2013.01); *H01L 27/0617* (2013.01); *H01L 29/0634* (2013.01); *H01L 29/1608* (2013.01); *H01L 29/7802* (2013.01)

(58) Field of Classification Search
CPC ............ H01L 29/7827; H01L 27/0617; H01L 29/1608; H01L 29/36; H01L 29/0688;
(Continued)

(56) References Cited

U.S. PATENT DOCUMENTS

| 10,186,575 B2 * | 1/2019 | Kawada ............... H01L 29/1095 |
| 2006/0175662 A1 * | 8/2006 | Tihanyi ............... H01L 29/7803 257/355 |

(Continued)

FOREIGN PATENT DOCUMENTS

| CN | 103840012 A | 6/2014 |
| CN | 103915506 A | 7/2014 |

(Continued)

OTHER PUBLICATIONS

Berthou, et al.: "Repetitive Short-Circuit tests on SiC VMOS devices," (Laboratoire Ampere, France), ICSCRM (2015), pp. 1-6.
(Continued)

*Primary Examiner* — Shouxiang Hu
(74) *Attorney, Agent, or Firm* — Norton Rose Fulbright US LLP; Gerard Messina

(57) ABSTRACT

A vertical SiC MOSFET having a source terminal, a drain terminal, and a gate region, as well as an epitaxial layer disposed between the source terminal and the drain terminal and having a doping of a first type, is furnished, a horizontally extending intermediate layer, which has regions having a doping of a second type different from the doping of a first type, being embedded into the epitaxial layer. The vertical SiC MOSFET is notable for the fact that at least the regions having doping of a second type are electrically conductively connected to the source terminal. The gate region can be disposed in a gate trench.

15 Claims, 9 Drawing Sheets

(51) Int. Cl.
*H01L 27/06* (2006.01)
*H01L 29/16* (2006.01)
*H01L 29/06* (2006.01)

(58) Field of Classification Search
CPC .............. H01L 29/1066; H01L 29/0623; H01L 29/7813; H01L 29/7805; H01L 29/7722; H01L 29/7803; H01L 29/8083; H01L 29/0634; H01L 29/7802; H01L 29/29; H01L 29/0696; H01L 29/7395; H01L 29/66712; H01L 29/66333; H01L 2924/13062
See application file for complete search history.

(56) References Cited

U.S. PATENT DOCUMENTS

| | | | |
|---|---|---|---|
| 2008/0173876 | A1 | 7/2008 | Ueno |
| 2009/0134402 | A1* | 5/2009 | Yatsuo .............. H01L 29/66068 257/77 |
| 2009/0152667 | A1 | 6/2009 | Rieger et al. |
| 2014/0021484 | A1 | 1/2014 | Siemieniec et al. |
| 2016/0329424 | A1* | 11/2016 | Qu ..................... H01L 29/1608 |

FOREIGN PATENT DOCUMENTS

| | | |
|---|---|---|
| DE | 102013224134 A1 | 5/2014 |
| DE | 102014000613 A1 | 7/2015 |
| EP | 1814162 A1 | 8/2007 |
| EP | 2418683 A1 | 2/2012 |
| JP | 2008172007 A | 7/2008 |
| JP | 2008177335 A | 7/2008 |

OTHER PUBLICATIONS

Harada, et al.: "Determination of optimum structure of 4H-SiC Trench MOSFET," Proceedings of the 2012 24th International Symposium on Power Semiconductor Devices and ICs, (2012), pp. 253-256.
Matocha, Kevin: "Challenges in SiC Power MOSFET Design," Solid-State Electronics 52 (2008), pp. 1631-1635.
Nakamura, et al.: "High Performance SiC Trench Devices with Ultra-Low Ron," 2011 IEEE International Electron Devices Meeting, pp. 599-601.
Tan, et al.: "High-Voltage Accumulation-Layer UMOSFET's in 4H-SiC," IEEE Electron Device Letters, 19 (12), (1998). pp. 487-489.
Tanaka, et al.: "Impact of Grounding the Bottom Oxide Protection Layer on the Short-Circuit Ruggedness of 4H-SiC Trench MOSFETs," (Mitsubishi Electr. Corp ), Proceedings of ISPSD & IC's (2014), Hawaii, pp. 75-78.
Wang, et al.: "Temperature-Dependent Short-Circuit Capability of Silicon Carbide Power MOSFETs," IEEE Transactions on Power Electronics, 31(2), (2016), pp. 1555-1566.
International Search Report for PCT/EP201 7/051895, dated Apr. 10, 2017.
"Short Circuit Robustness of 1200 V Sic Junction Transistors and Power MOSFETs," Siddarth Sundaresan et al., KGeneSIC Semiconductor) ICSCRM 2015.

* cited by examiner

VERTICAL SIC MOSFET

FIELD OF THE INVENTION

The present invention relates to a vertical SiC MOSFET, i.e. to a metal oxide semiconductor field effect transistor (MOSFET) that is manufactured on the basis of silicon carbide and whose elements are disposed predominantly vertically one above another. In particular, the direction of the current flow is also oriented substantially vertically.

BACKGROUND INFORMATION

Semiconductor components, in particular power components such as power MOSFETs, have a variety of criteria to be optimized. For example, a high short-circuit strength, i.e. withstanding a short-circuit situation in the form of zero-load operation without damage, is desirable. Low values for $R_{dson}$, i.e. the resistance between drain and source in the "on" state, are also generally advantageous in order to reduce power loss. Classically, in conventional MOSFETs the two values are directly correlated with one another: a typical conventional metal oxide semiconductor field effect transistor (MOSFET), which is considered here as a representative of a power MOSFET, is governed by the elementary MOSFET equations according to which the saturation current is:

$$I_{dsat} = \frac{1}{2R^*_{dson}}(V_g - V_{th}),$$

where $V_g$ denotes the applied gate voltage, $V_{th}$ the inception threshold voltage of the MOS channel, and $R^*_{dson} = R_{dson} - R_{drift}$ the channel resistance of the MOSFET in the linear region. What is obtained for the constant $K_F$ $$K_F = \frac{1}{2\, I_{dsat} R^*_{dson}}(V_g - V_{th})$$

for the MOSFET according to the existing art is the value $K_F=1$ (for $I_{dsat}$ measured at the beginning of the linear operation plateau).

The short-circuit strength is typically energy-limited, for example due to melting of the aluminum metallization after impression of the short-circuit energy $E_{sc,max}$, so that as defined by $$T_{scwt} = \frac{E_{sc,max}}{I_{dsat} \cdot U_{ds}} \sim R^*_{dson},$$

the achievable short-circuit time $t_{scwt}$ for an applied voltage $U_{ds}$ depends directly on $R^*_{dson}$. In conventional MOSFETs, a decrease in $R^*_{dson}$ therefore automatically results in a reduction in short-circuit strength; in other words, $R^*_{dson}$ and short-circuit strength cannot be optimized independently of one another.

In traction applications, a guaranteed short-circuit strength of $t_{scwt} > 10$ µs is state of the art for Si-based 1200 V semiconductors such as insulated gate bipolar transistors (IGBTs). That value is not attained by present-day SiC MOSFET concepts, and is even more difficult to achieve as a result of the cost-driven trend toward lower $R_{dson}$ values. See for example:

"Short Circuit Robustness of 1200 V SiC Junction Transistors and Power MOSFETs," Siddarth Sundaresan et al. (GeneSiC Semiconductor) ICSCRM 2015;

"Repetitive Short-Circuit Tests on SiC VMOS Devices," Maxime Berthou et al. (Laboratoire Ampère, France), ICSCRM 2015;

"Concept with Grounded Bottom Layer from Mitsubishi," "Impact of Grounding the Bottom Oxide Protection Layer on the Short-Circuit Ruggedness of 4H—SiC Trench MOSFETs," R. Tanaka et al. (Mitsubishi Electr. Corp.), ISPSD 2014;

"Temperature-Dependent Short-Circuit Capability of Silicon Carbide Power MOSFETs," Z. Wang et al. (Univ. of Tennessee), IEEE Transactions on Power Electronics, Vol. 31, No. 2, February 2016.

Excessively high fields in the gate oxide can be a further problem. In principle, the gate oxide on silicon carbide (SiC) has a lower band offset in the conduction band than comparable silicon components, so that degradation as a result of tunneling currents already occurs at lower gate field strengths. For SiC MOSFETs, a useful field strength in the gate oxide is approximately 3 MV/cm. Conforming to that limit value is critical especially in blocking mode and, for trench devices in particular, necessitates design measures to limit the gate field strength (see e.g. Kevin Matocha, "Challenges in SiC Power MOSFET Design," Solid State Electronics 52 (2008) 1631-1635; "High Performance SiC Trench Devices with Ultra-Low Ron," T. Nakamura et al., 2011 IEEE International Electron Devices Meeting, pp. 26.51-26.53).

Possibilities for at least limiting the gate field strength are known from the existing art. For instance, the field strength at the gate oxide can be reduced by introducing a double trench with deep p implantation, such that the deeper p regions electrostatically shield the actual trench MOSFET structure (see e.g. Nakamura et al.).

Field strengths at the gate oxide can also be reduced to approx. 4 MV/cm by introducing p-doped regions (called "p bubbles") below the gate oxide (see e.g. "High Voltage Accumulation-Layer UMOSFETs in 4H—SiC," J. Tan et al., IEEE Electron Device Letters, Vol. 19, No. 12, December 1998).

Alternatively, the two measures recited above (double trench, p bubbles) can be combined (see Shinsuke Harada et al., "Determination of Optimum Structure of 4H—SiC MOSFET," Proceedings of the 2012 24th International Symposium on Power Semiconductor Devices and ICs, pp. 253 ff.). A corresponding doping profile with no double trench is conceivable as a further variant if the p regions are implanted very deep.

German Published Patent Application No. 10 2014 00613 discloses a vertical trench MOSFET that has, within the epitaxial layer, an oppositely doped compensation layer allowing the maximum field strengths that occur to be limited.

SUMMARY

The present invention makes available a vertical SiC MOSFET having a source terminal, a drain terminal, and a gate region, and having an epitaxial layer that is disposed between the source terminal and the drain terminal and has a doping of a first type, a horizontally extending intermediate layer, which has regions having a doping of a second type different from the doping of a first type, being embedded into the epitaxial layer, at least the regions having doping of a second type being electrically conductively connected to the source terminal. A further plane that has at least regions having doping opposite from the doping of the epitaxial layer is therefore located below the conventional MOS structure.

The statement that the intermediate layer is "embedded" into the epitaxial layer is understood to mean in particular that the intermediate layer is surrounded on both sides by the epitaxial layer. It can therefore be stated that the epitaxial layer is divided by the intermediate layer into an upper region that as a rule is located on that side of the intermediate layer which faces toward the source terminal, and a lower region that as a rule is located on that side of the intermediate layer which faces toward the drain terminal. In a special instance, further regions or layers can be disposed between the intermediate layer and the upper and/or lower region of the epitaxial layer. It is likewise possible, however, for the intermediate layer to be respectively adjacent directly, and in a special instance over its entire surface, to the upper and/or the lower region of the epitaxial layer. The upper and the lower region of the epitaxial layer can have identical or different doping concentrations.

The SiC MOSFET according to the present invention has the advantage that the current through the component in the event of a short circuit can be effectively limited. It is thereby possible to manufacture components having particularly high levels of short-circuit robustness which were not previously obtainable for SiC technology.

Because the concept according to the present invention is vertically integrated, the additional structures do not create any additional space requirement on the chip.

The invention is thus area-neutral in terms of $R_{dson}*A$ as compared with conventional components.

The design according to the present invention furthermore offers the advantage that the field strength in the gate oxide is limited to a level below 3 MV in order to meet stringent requirements in terms of component service life. It is thus possible both to limit the current in the event of a short circuit, and to effectively shield the gate oxide in blocking mode when a voltage is applied.

Reliability advantages are accordingly achieved by shielding the MOS channel from the drain field, and a reduction in short-channel effects is also made possible in the form of a rise in saturation current with rising drain voltage; this is likewise advantageous with regard to short-circuit strength.

It is also possible for the intermediate layer to have both first-doping-type regions and second-doping-type regions. The properties of the MOSFET can then be adjusted in controlled fashion by selecting the dimensioning and doping concentration of the various regions. Both the first-doping-type and second-doping-type regions can extend over the entire layer thickness.

Advantageously, provision is made that the second-doping-type regions are not completely cleared out when a voltage less than or equal to a blocking voltage of the SiC MOSFET is applied. This can be achieved by heavy doping, for example at least $5*10^{17}/cm^3$. It is advantageous in this context if the doping changes laterally from one region to the other region as abruptly as possible. In other words, if possible, no (or only very small) transition regions having lighter doping or mixed doping are present. Because the regions having doping of a second type furnish, in the blocking instance, considerable counter-charge for reception of the blocking voltage thanks to clearing of those regions, the channel length of the MOSFET can be reduced. This results in an advantageous decrease in $R_{dson}$.

It is advantageously possible for the intermediate layer to be disposed entirely below the gate region. A relatively simple physical structure then results. The statement that the intermediate layer is disposed "below" the gate region is understood in particular to mean that the intermediate layer is disposed vertically between the gate region and the drain region. Elements of the gate region, for example a gate trench, therefore do not intersect or interrupt the intermediate layer.

According to a preferred embodiment of the invention, provision is made that the intermediate layer, together with the epitaxial layer, functionally constitutes a junction field effect transistor. In the static blocking state with the gate shut off, the first-doping-type regions are cleared out with increasing drain voltage, i.e. no further quasi-neutral regions are present in the intermediate layer in regions having a first type of doping, so that a further increase in the drain voltage can be absorbed substantially by the JFET. The current flowing through the MOSFET in the event of a short circuit can then be effectively limited by the junction field effect transistor (junction FET or JFET).

The statement that regions are "not completely cleared" is understood in particular to mean that quasi-neutral areas are still present in the relevant region even after application of the blocking voltage.

This furthermore yields a further design parameter, since the MOS region in the upper part of the MOSFET can now be designed for a substantially lower blocking voltage, since the intermediate layer, or the JFET, absorbs a substantial portion of the blocking voltage. Cleared counter-charge is furnished in the blocking state, so that only a substantially smaller electric field is present at the actual MOS structure, and less counter-charge is therefore necessary in the body. This allows the reduction in channel length as compared with the existing art.

This is achieved by the fact that the thickness and doping ($NA=PP_{jfet}$) of the regions having doping of a second type are selected so that the voltage of the drift zone can be dissipated at least by the charge of the regions having doping of a second type. This yields the following design rule (for constant dopings):

$$l_{jfet} \gg l_{EPI} \frac{|ND_{EPI}|*(dp_{jfet}+d_{jfet})}{(|NA|*dp_{jfet}-|ND|*d_{jfet})},$$

where $l_{jfet}$ is the thickness of the intermediate layer, $l_{EPI}$ the thickness of the epitaxial layer, $ND_{EPI}$ the doping concentration of the epitaxial layer, ND the doping concentration of the first-doping-type regions of the intermediate layer, NA the doping concentration of the second-doping-type regions of the intermediate layer, $d_{jfet}$ the horizontal extent of the first-doping-type regions of the intermediate layer, and $dp_{jfet}$ the horizontal extent of the second-doping-type regions of the intermediate layer. A specific useful selection of doping ratios is, for instance, $ND=n_{jfet}>N_{EPI}$, $NA=pp_{jfet}>ND$.

If the dopings in the intermediate layer and in the EPI layer are not constant in portions, instead of the products of NA, ND, and the dimensions, the corresponding volume integrals are to be used.

As a result of the JFET functionality, the sheet charge density in the body can be reduced in accordance with the equation $qb_{new}=qb_{old}-q_{JFET}+Delta_{3D}$, where $qb_{new}$ is the sheet charge density, reduced according to the present invention, in the body; $qb_{old}$ is the sheet charge density in the body of a conventional MOSFET, as would be necessary in a design having no JFET region; $q_{JFET}$ is the effective charge, at maximum voltage, of the intermediate layer, functioning as a JFET region, in the partly cleared state in accordance with the field distribution in the blocking state; and $Delta_{3D}$ is an adaptation term for three-dimensional effects and a safety margin for sufficient blocking strength so that punching through the body to the source does not occur.

A refinement of the invention provides that a transition layer, having heavier doping of a first type as compared with the epitaxial layer, vertically adjoins the intermediate layer in the direction of the source terminal and/or in the direction of the drain terminal. This prevents the vertical p-n transitions to second-doping-type regions of the intermediate layer from resulting in excessively large vertical space charge zones or current constrictions above and below the intermediate layer.

It is furthermore advantageous if a transition layer, having heavier doping of a first type as compared with the epitaxial layer, vertically adjoins the epitaxial layer in the direction of the source terminal. In other words, the transition layer is therefore adjacent to the upper region of the epitaxial layer. Here as well, current constrictions at the p-n transitions are avoided.

For the same reason, it is favorable if an upper part, disposed between the source terminal and the intermediate layer, of the epitaxial layer has heavier doping of a first type, in particular doping of a first type that is heavier by a factor of 2 to 4, than a lower part, disposed between the intermediate layer and the drain terminal, of the epitaxial layer.

The above-described transition layers that have heavier, i.e. more highly concentrated, doping of a first type, and that adjoin the epitaxial layer can also be referred to as "spread layers." Advantageously, in configuring the spread layers the design rule adhered to is that the total dose of introduced dopings is kept constant as compared with the single epitaxial layer. In other words, when the concentration is raised at one point, a lower doping concentration is selected at another point in order to create an equalization.

A refinement of the invention provides that the first-doping-type regions of the intermediate layer are adjoined vertically in the direction of the source terminal and/or in the direction of the drain terminal by transition regions having a heavier doping of a first type as compared with the epitaxial layer, the epitaxial layer being at least in part adjacent to the second-doping-type regions of the intermediate layer. What is used here, as compared with the embodiment described above, is not complete spread layers but instead only transition regions or spread regions that are adjacent to the second-doping-type regions of the intermediate layer. A further optimization of the on-state resistance of the MOSFET is thereby obtained. The design described can be implemented in practice, for example, by multiple implantation at different depths in combination with a mask spacer.

A special embodiment of the invention provides that the first-doping-type regions of the intermediate layer have a double-funnel-shaped profile or an hourglass-shaped profile. In other words, the horizontal extent of the first-doping-type regions of the intermediate layer tapers respectively from the top and bottom toward the center of the intermediate layer. This measure also allows the breakdown voltage to be increased. All the measures described can of course be combined with one another if geometrically possible.

An advantageous embodiment of the invention provides that a channel of the junction field effect transistor and a channel of the MOSFET are disposed vertically one above another. The periodicity (cell pitch) of the junction field effect transistor can correspond to half the cell pitch of the trench MOS cells.

It is thereby possible to minimize the contributions of the junction field effect transistor to the resistance $R_{Dson}$. Proceeding from an optimal position, the functionality of the component is relatively insensitive to a lateral shift (misalignment) of the JFET region with respect to the MOS region, or to a change in the value of $dp_{JFET}$.

Provision is advantageously made that the functional junction field effect transistor is connected electrically in series with the MOSFET. The "MOSFET" is understood here as the conventional, functional MOSFET within the component, i.e. in general as that region of the component which is disposed above the intermediate layer. Integration of a MOSFET-JFET cascade designed for short-circuit strength in a single component is thereby enabled. An advantage of this configuration is that the JFET is counter-coupled to the MOSFET via the voltage drop of the MOS region, thus placing an upper limit on the current: if the drain current rises sufficiently that the voltage drop across the MOS region is of the same order of magnitude as the value of the pinch voltage of the JFET, the JFET then makes a critical contribution to current limiting. The drain current is then limited by the fact that the threshold condition (pinch voltage) of the JFET is reached. Channel length modulation, and thus a further increase in the saturation current of the MOSFET at high drain voltages, are thus avoided. The point at which the threshold condition is reached can be adjusted within certain limits by way of the voltage drop or via the doping of the MOS region and the pinch voltage.

The JFET channels within the JFET region and within the intermediate layer can also have a different periodicity and/or a different orientation from the MOS cells. In other words, the elements of the MOS structure which are disposed on a specific width of the chip can differ from the elements of the intermediate layer in terms of number and spacing. Any angle can also be present between the alignment of the elements of the MOS plane, i.e. for example the gate electrodes, and the alignment of the elements of the intermediate plane.

Other JFET gate shapes, for example a honeycomb structure, a square structure, or the like, are also possible. A typical dimension of the first-doping-type regions of the intermediate layer is in the vicinity of 500 nm. Advantageously, the lateral extent of the second-doping-type regions of the intermediate layer is somewhat greater than that of the first-doping-type regions, for example by a factor of 1.2 or 1.5. The number of first- and second-doping-type regions per unit cell of the MOS structure, i.e. per gate trench, is then obtained from the ratio between the spacing of those MOS structures and the periodicity of the intermediate layer.

The MOS structure can be present on the chip (plan view or layout) as a linear structure or two-dimensional grid structure. Three-dimensional structures such as square grids, honeycombs, or hexagonal grids can also be present within the plane of the JFET layer and of the intermediate plane. Those structures can, in principle, be combined with any desired analogous periodic JFET grid structure.

Advantageous refinements of the invention are indicated in the dependent claims and described in the description.

DETAILED DESCRIPTION

Figure 1:
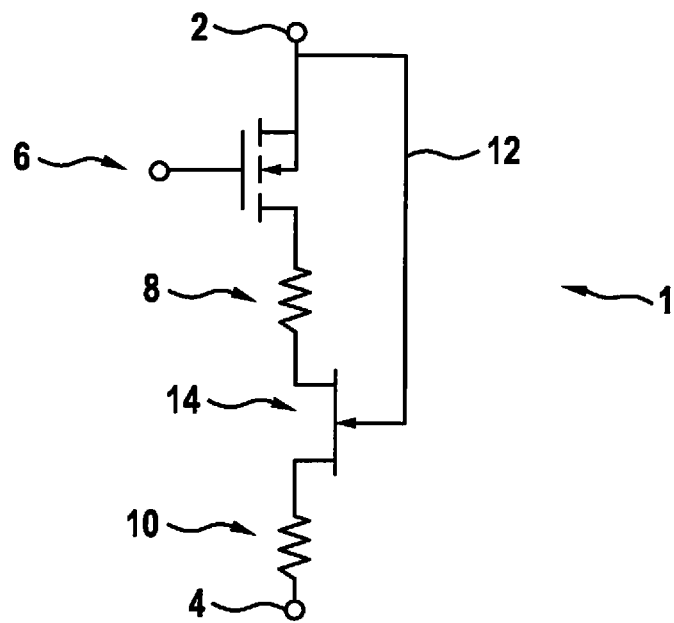
FIG. 1 is an equivalent circuit diagram of an embodiment of the invention.

FIG. 1 is an equivalent circuit diagram of an embodiment of the invention showing the typical elements of a MOSFET 1, namely source terminal 2, drain terminal 4, and gate terminal 6. Also shown are two resistances, namely the resistance of MOS region 8 and the resistance of drift region 10. The conductive connection 12 between source terminal 2 and JFET gate 14 results in formation of a junction field effect transistor that effectively limits high currents through the component.

When the voltage dropping across MOS region 6 and 8 becomes greater than or equal to the value of the pinch voltage of the junction field effect transistor, the latter absorbs the further drain voltage increase. Channel length modulation, and thus a further rise in the saturation current of the MOSFET at high drain voltages, are thus avoided. The exact manner in which the junction field effect transistor, or JFET, functions will be further explained below with reference to the additional Figures.

Figure 2:
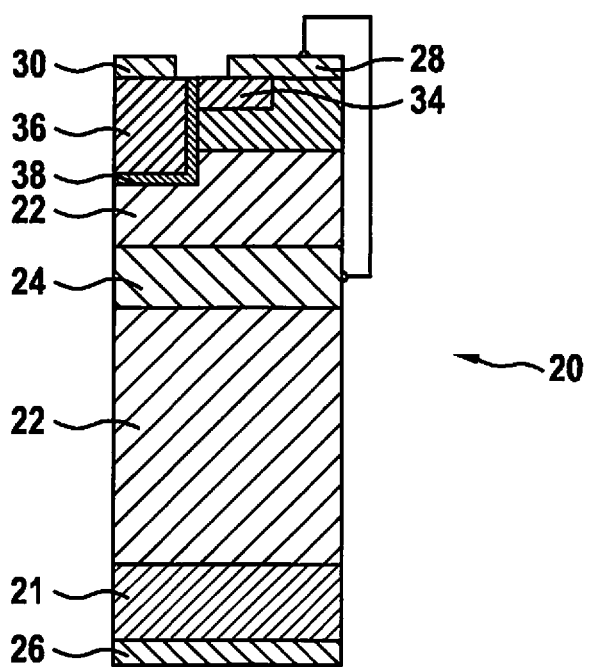
FIG. 2 is a cross section through an exemplifying embodiment of a MOSFET according to the present invention.

FIG. 2 is a cross section through an exemplifying embodiment of a MOSFET 20 according to the present invention. Only a portion of the component is shown; the component can typically be made up of a plurality of unit cells. Some elements of MOSFET 20 are also not completely depicted.

An n-doped epitaxial layer 22, in which an intermediate layer 24 is in turn embedded, is applied onto a typically heavily doped substrate 21. In practice, the epitaxial layer is divided into an upper region 22.1 and a lower region 22.2. Toward the bottom, a metallization 26 represents the drain terminal. Intermediate layer 24 is depicted in FIG. 2 at first without further details. The typical elements of a trench MOSFET 20 are depicted in the top region of the Figure: a metallization 28 constituting source contact 2, and a metallization 30 constituting a gate contact, are evident. Also depicted are the n-doped source region 34 as well as gate region 36 disposed in a trench structure. Gate region 36 is separated by an insulating layer 38 from source region 32 and from epitaxial layer 22. When a voltage is applied between source contact 2 and gate contact 4, an electrical current flows from top to bottom in the Figure, i.e. vertically, through MOSFET 20 when a voltage above the threshold voltage of MOSFET 20 is present at gate contact 32 and a voltage that is positive with respect to source contact 28 is present at drain 26.

Figure 3:
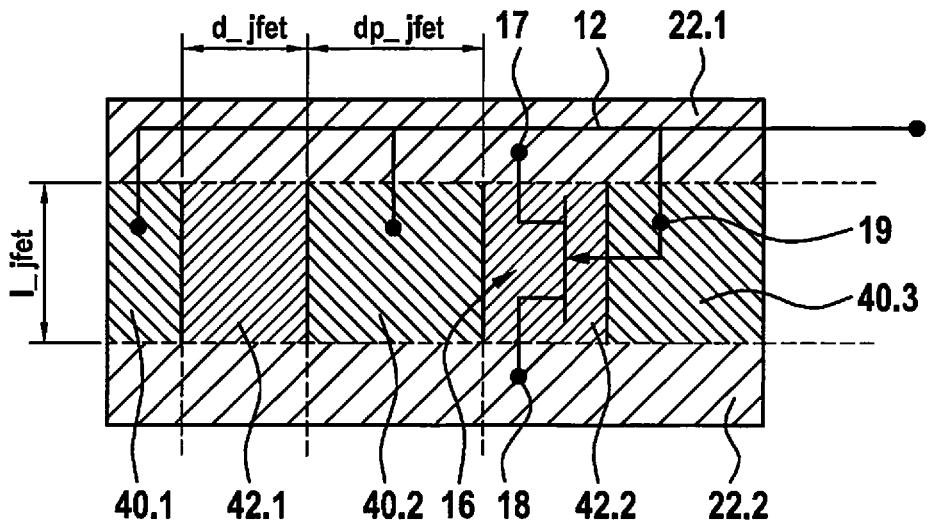
FIG. 3 is a detailed depiction of the intermediate layer of FIG. 2.

FIG. 3 is a detailed depiction of intermediate layer 24 of FIG. 2. Also shown, respectively in the upper and lower region of the Figure, are the upper and lower parts 22.1, 22.2 of the epitaxial layer that adjoins intermediate layer 24. It is evident that intermediate layer 24 has a special structure in a horizontal or lateral direction. For example, p-doped regions 40.1, 40.2, and 40.3, as well as n-doped regions 42.1 and 42.2, are present in the intermediate layer. Be it noted once again at this juncture that, as is usual with MOSFETs, the exemplifying embodiments depicted can also be manufactured with respectively reversed doping.

Important design parameters for the functionality of component 20 are the dimensions of p-doped regions 40 and of n-doped regions 42, and the thickness $l_{jfet}$ of intermediate layer 22. Intermediate layer 22 as such constitutes, in its entirety, the so-called JFET region. The width of p-doped regions 40 is labeled $dp_{jfet}$, and the width of the n-doped regions 42 is labeled $d_{jfet}$. Also schematically depicted is conductive connection 12 that creates the electrical connection between p-doped regions 40 and source terminal 2. Also depicted, schematically and merely in order to illustrate the functional principle, is circuit symbol 16 of the junction field effect transistor, whose source terminal 17 is located in the upper (in the Figure) region of epitaxial layer 22, whereas drain terminal 18 of junction field effect transistor 16 is located in the lower region of epitaxial layer 22. Gate terminal 19 of the junction field effect transistor is connected to p-doped regions 40. Those p-doped regions 40 thus represent the gate of junction field effect transistor 16.

Figure 4:
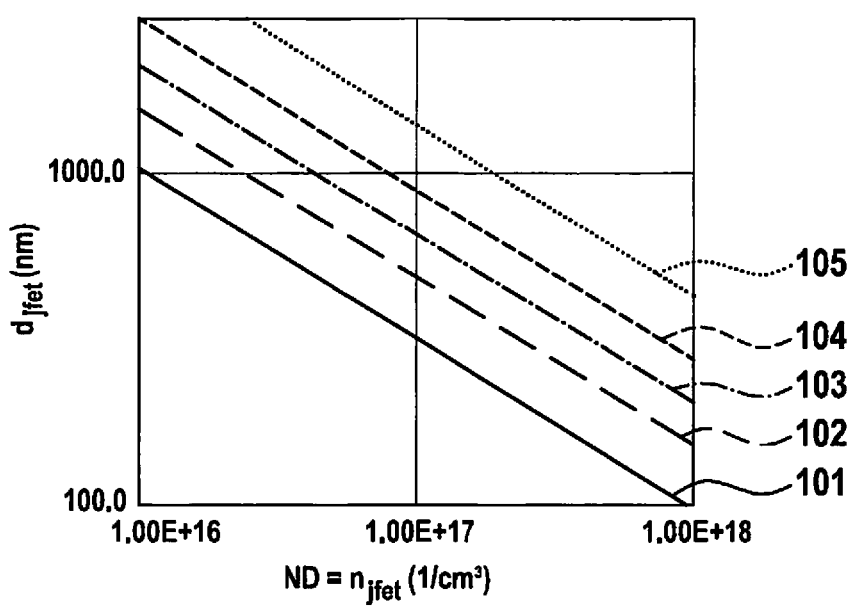
FIG. 4 is a diagram in which possible doping concentrations are plotted.

The dopings of regions 40 and 42 are a further important design parameter. FIG. 4 is a diagram in which possible doping concentrations for n-doped regions 42 are plotted as a function of the width of n-doped regions 42 for various JFET pinch voltages $U_{gJFET.thr}$; in other words, the pinch voltage of the JFET can be adjusted by corresponding selection of the parameters. All the values depicted were calculated for a doping concentration of $5*10^{18}/cm^3$ for the p-doped areas. Curve 101 applies to the minimum value for d_jfet for the respective doping concentration. Curve 102 applies to a JFET pinch voltage Ugthr=5 V, curve 103 to a JFET pinch voltage Ugthr=10 V, curve 104 to a JFET pinch voltage Ugthr=20 V, and curve 105 to a JFET pinch voltage Ugthr=50 V.

Figure 5:
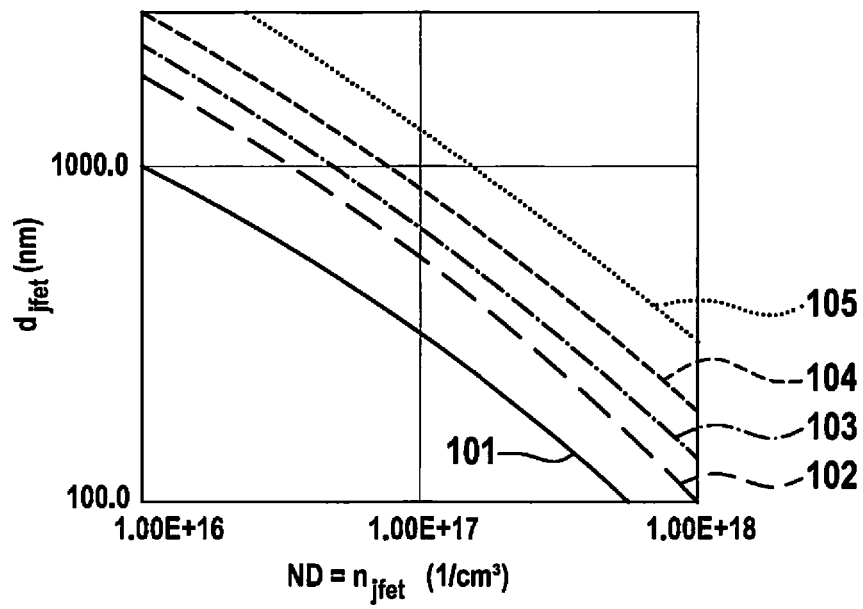
FIG. 5 is a further diagram in which possible doping concentrations are plotted.

FIG. 5 is a diagram analogous to FIG. 4, except that it is based on a doping concentration of $5*10^{17}/cm^3$ for the p-doped regions.

Figure 6:
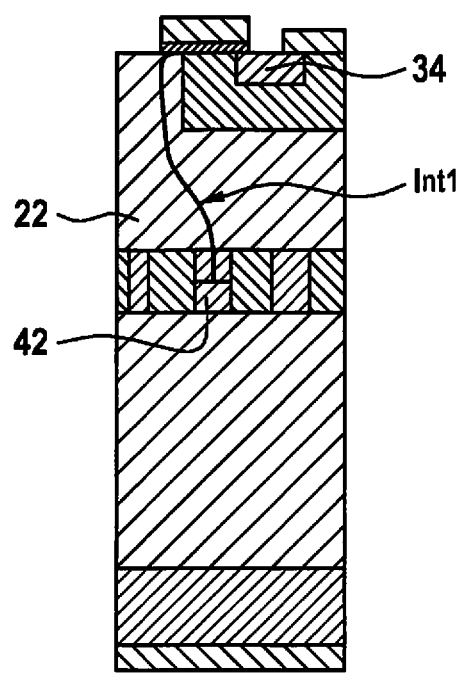
FIG. 6 is a cross section through an embodiment in which a path for a line integral is schematically drawn.

The pinch voltage $U_{gJFET.thr}$ of the JFET region, which is present between contacts 17 and 19 (see e.g. FIGS. 2 and 3), is characterized in that the n-side space charge zones become as large as $d_{jfet}$, i.e. the quasi-neutral areas of the n-majority charge carriers of n-doped regions 42 between p-doped regions 40 disappear. In order to take the short-circuit behavior into account, the depth $t_{jfet}$ and the n-doping inside the MOS region are selected so that for the desired saturation current $I_{Dsat}$ with an applied voltage $U_{ds}=U_{cc}$, which typically corresponds to 50% of the nominal blocking strength of the components, a potential drop "$U_{MOS}$" as far as the n-opening of JFET opening 24 is achieved for n-majority charge carriers, shifting the JFET into the current-limiting state. In other words, the result of the pre-voltage is that the space charge zone of the p-n connections surrounding n-layer 42 becomes enlarged to the point that it is larger than or equal to $d_{jfet}$. $U_{MOS}$ advantageously has values of at least 1 V, typically between 5 V and 20 V. A useful upper limit can be equal to 20% of the blocking voltage. The following apply:

$$U_{MOS} = U_{gJFET_{thr}} \text{ and } U_{MOS} \equiv \int_{Int1(t_{jfet})} \vec{E}\,d\vec{l},$$

the path for the line integral being shown in FIG. 6 as Int1. The line integral Int1 extends from source region 34 through epitaxial layer 22 to n-doped region 42.

The lateral extent and doping of n-regions 40 and p-regions 42 within the JFET region are selected so that at $U_{ds}=0$ V, the n-opening $d_{jfet}$ is larger than the double n-side space charge zone of the p-n connection between NA and ND, so that in the zero-voltage state, n-majority charge carriers are left over for current transport within the n-region of the JFET region.

The following ideally typical design rule is thus obtained for the case of an abrupt one-dimensional p-n transition:

$$d_{jfet} > 2 * \sqrt{\frac{2\,\varepsilon_r\,\varepsilon_0}{q_{el}} U_{bi} \frac{ND}{NA*(NA+ND)}}.$$

The limit value for $d_{jfet}$ corresponds to the respective lowest curve, drawn as d_jfet_min, in FIG. 4 and FIG. 5. For real, physical geometries and doping distributions, the corresponding correlations cannot be represented analytically but are present all the same and are numerically solvable. $U_{bi}$ refers here to the "built-in" voltage that already drops across the p-n transition, without an external applied voltage, due to the dopings in the valence band and conduction band. NA is the p-doping concentration and ND the n-doping concentration.

Figure 7:
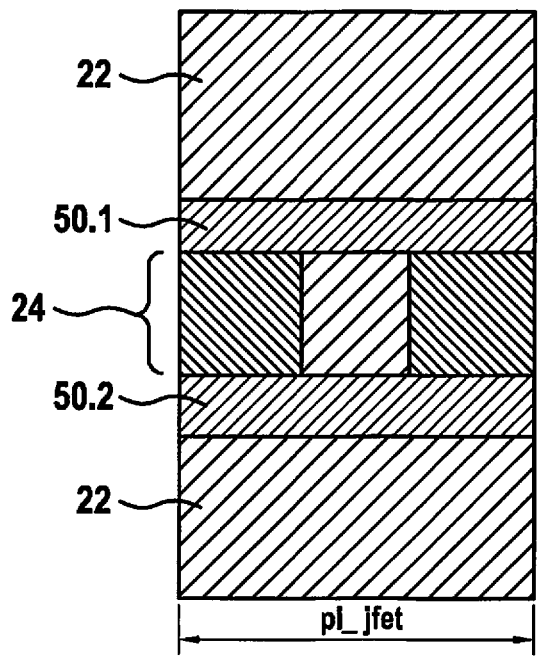
FIG. 7 is a cross section through an embodiment having transition layers.

FIG. 7 is a cross section through an embodiment having transition layers 50.1, 50.2 that are disposed respectively above and below intermediate layer 24. Transition layers 50.1, 50.2 each have an n-doping of higher concentration than the respective epitaxial layer 22.1 and 22.2. A configuration of this kind prevents the formation of large space charge zones or current constrictions at the vertical p-n transitions to p-doped regions 40. Also shown is $pl_{jfet}$ constituting a lateral dimension of the JFET structure.

Figure 8:
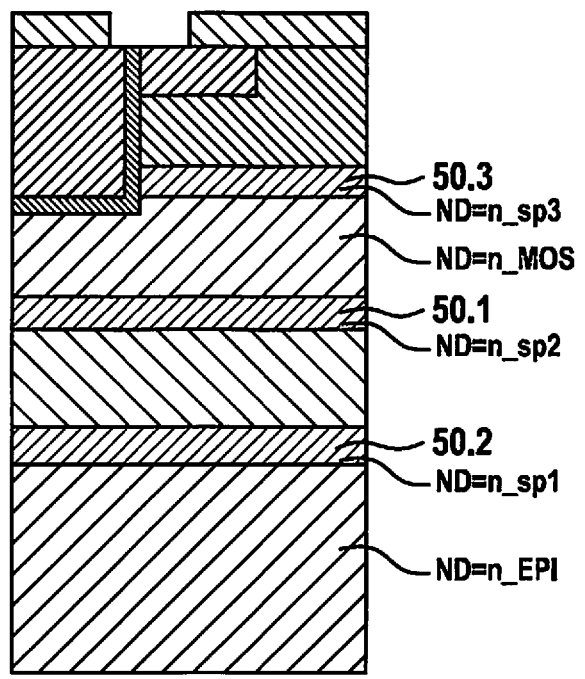
FIG. 8 shows a refinement of the exemplifying embodiment shown in FIG. 7.

FIG. 8 shows a refinement of the exemplifying embodiment shown in FIG. 6, notable for a third transition layer 50.3 that is disposed between source region 34 and epitaxial layer 22. It is also evident that the dopings of the three transition layers $n_{sp1}$, $n_{sp2}$, and $n_{sp3}$ can be different.

Figure 9:
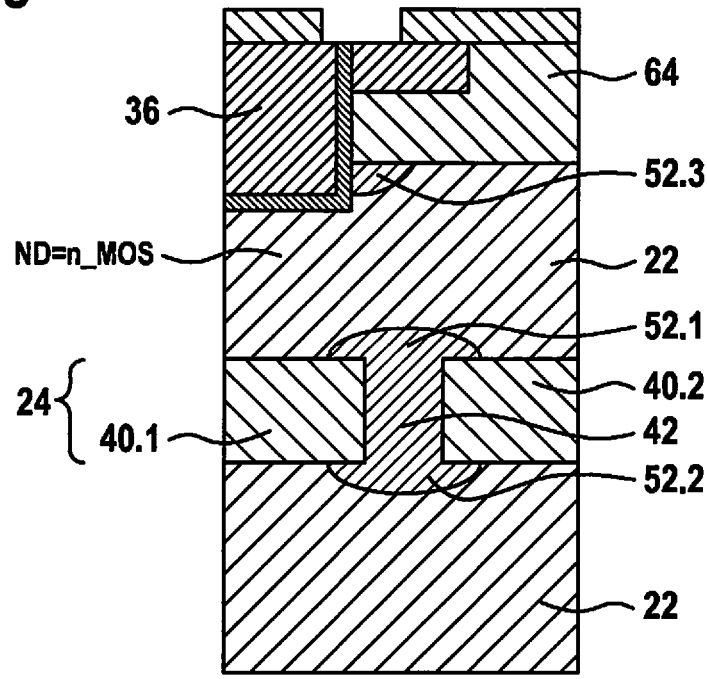
FIG. 9 shows a further exemplifying embodiment of the invention.

FIG. 9 shows a variant in which the transition layers do not cover the entire cross section of the MOSFET but extend only locally in the layers in question. They are therefore referred to as "transition regions" or "spread regions" 52.1, 52.2, 52.3. Transition region 52.1 is located in turn above intermediate layer 24 in the region between intermediate layer 24 and epitaxial layer 22. Transition region 52.2 is located below intermediate layer 24 between intermediate layer 24 and epitaxial layer 22. Transition regions 52.1, 52.2 respectively span n-doped region 42 between two p-doped regions 40.1, 40.2. They furthermore cover a small portion of the adjacent p-doped region 40.1, 40.2 on both sides of the n-doped region of intermediate layer 24. The extent of transition regions 52.1, 52.2 beyond the "gap" between p-doped regions 40.1, 40.2 is approximately equal in size to half the width of the n-doped region in the intermediate layer.

Third transition region 52.3 is disposed in the region in which gate region 36, p-body 64, and epitaxial layer 22 adjoin one another. It has a relatively small extent. It is apparent that NA and ND, i.e. $pp_{jfet}$ and $n_{jfet}$, $ND_{EPI}$, and the doping between MOSFET body and the JFET region do not need to be constant, but can instead exhibit a local dependence.

Figure 10:
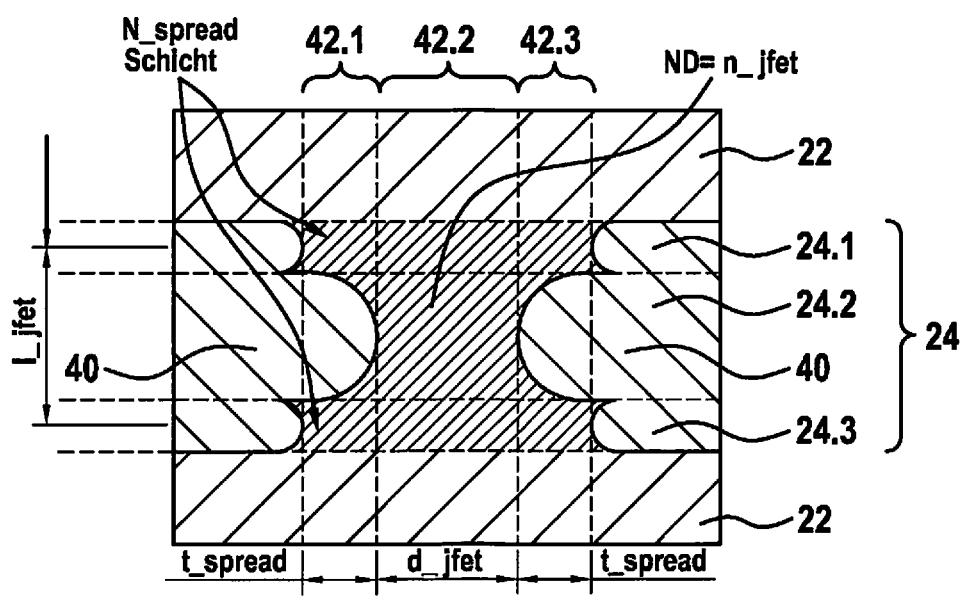
FIG. 10 shows an alternative possibility for embodying the intermediate layer.

FIG. 10 shows a further possibility for configuring intermediate layer 24. Here as well, the objective is to avoid current constrictions. In the exemplifying embodiment depicted, this is achieved by the fact that p-doped regions 40 are slightly "retracted" in the vicinity of epitaxial layer 22. Intermediate layer 24 can be understood here as being constructed from three separate layers 24.1, 24.2, 24.3 that in principle are constructed identically but differ in terms of lateral extent. Middle layer 24.2 is constructed substantially as in the exemplifying embodiments already described. It can be the thickest of the three layers 24.1, 24.2, 24.3. In particular, the width of n-doped region 42.2 of middle layer 24.2 is equal to the width of n-doped regions 40 in the exemplifying embodiments already described. Upper layer 24.1 and lower layer 24.3 of n-doped region 42, however, have a greater extent. The overall result is a roughly hourglass-shaped or double-funnel-shaped cross section for n-doped region 40.

Figure 11:
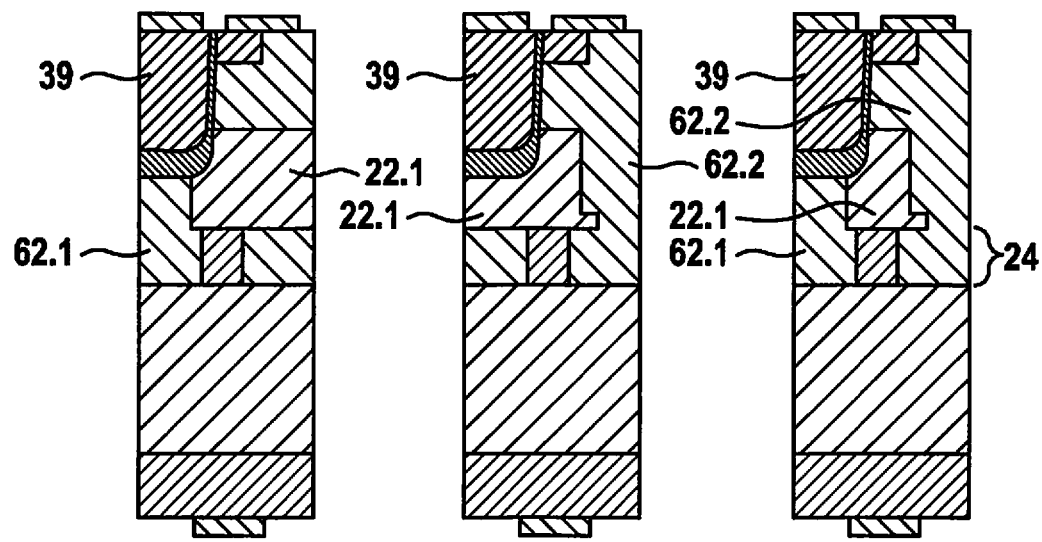
FIG. 11 shows three embodiments that differ in terms of the configuration of the epitaxial layer above the intermediate layer.

FIG. 11 shows three embodiments that differ in terms of the configuration of epitaxial layer 22.1 above intermediate layer 24. The left-hand portion of the Figure shows an exemplifying embodiment in which a p-doped region 62.1, extending as far as intermediate layer 24, is introduced below gate trench 39 in epitaxial layer 22. In other words, the region between gate trench 39 and intermediate layer 24 is filled for the most part with p-doped material. That region of intermediate layer 24 which is located below gate trench 39 is also made of p-doped material. As compared with the embodiments so far described, n-doped material below gate trench 39 has therefore been replaced by p-doped material.

In the middle portion of FIG. 11, a further p-doped region 62.2 is disposed below p-body region 64. This region as well is disposed substantially congruently above a p-doped region 40 of intermediate layer 24. The right-hand portion of FIG. 11 shows an exemplifying embodiment that combines the two versions with one another, i.e. has both p-doped region 62.1 and p-doped region 62.2. All the embodiments shown in FIG. 11 have the advantage that p-charges which are not located in the channel region are made available.

Figure 12:
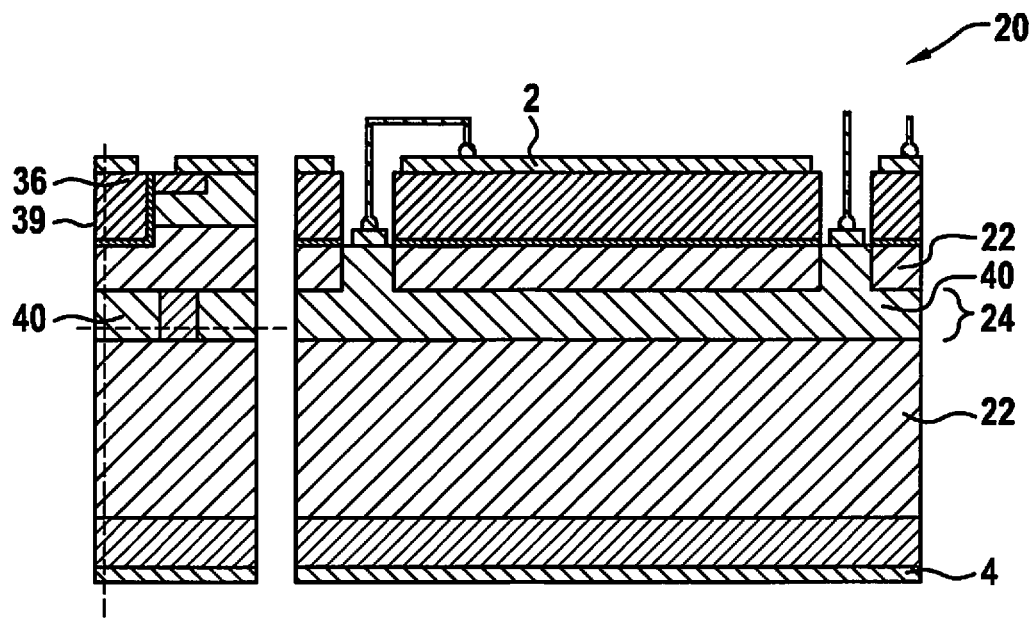
FIG. 12 shows a longitudinal section and a cross section through an exemplifying embodiment analogous to the exemplifying embodiment shown in FIGS. 2 and 3.

FIG. 12 shows a longitudinal section and a cross section through an exemplifying embodiment analogous to the exemplifying embodiment shown in FIGS. 2 and 3. The dashed line extending vertically identifies the section plane of the section depicted in the right-hand portion of FIG. 12. It is evident that p-doped areas 40 are conductively connected to source pad 2. It is further evident that gate electrode 36 disposed in gate trench 39 has been partly interrupted for contacting. Contacting can be implemented technically, for example, by way of a contact implant in trench 39 in combination with p-doped crosspieces 60 between the p-doped regions. Those crosspieces 60 are shown in FIG. 13.

Contacting via a deep contact implant is also possible. With two JFET channels for each MOS cell that extends in parallel, no crosspieces are then necessary for electrical connection of the p-regions. The contacts are not limited to JFET structures proceeding parallel to the trench, but can instead also be made in spot fashion at contact spots between JFET grids (p-areas of the JFET region) and the contact configurations. Contacting of the p-areas outside the active MOS cells is also conceivable.

Figure 13:
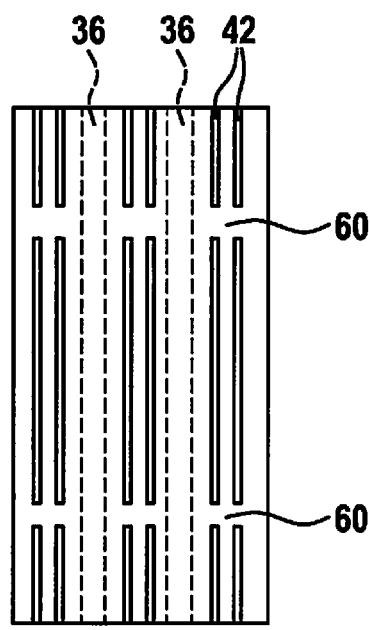
FIG. 13 is a horizontal section through the exemplifying embodiment of FIG. 11.

FIG. 13 is a horizontal section along the horizontal dashed line of FIG. 12. The section thus proceeds through intermediate layer 24 and parallel to it. Gate regions 36 located inherently above the plane that is depicted are drawn with dashed lines. Once vertical contacting of p-doped areas 40 has been brought about by way of the interruptions in trenches 39, it is apparent here that the individual p-doped areas 40 are connected to one another by the fact that n-doped regions 42 of intermediate layer 24 are interrupted.

Figure 14:
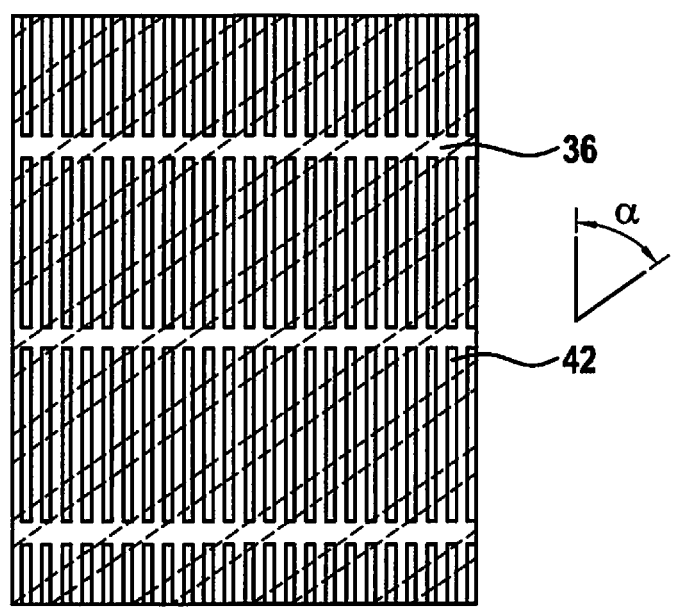
FIG. 14 is a depiction analogous to FIG. 13.

FIG. 14 is a depiction analogous to FIG. 13. On the basis of gate regions 36, once again drawn as dashed lines, it is apparent that intermediate plane 24 can be rotated through any angle α with respect to the remainder of the MOSFET. In other words, an angle of, for example, 20°, 45°, or even 90° can exist between, for example, gate trenches 39 and n-doped regions 42 of intermediate layer 24. The n-doped regions 42 of intermediate layer 24 can, however, of course also extend parallel to gate regions 39. Different periodicities are also possible.

Figure 15:
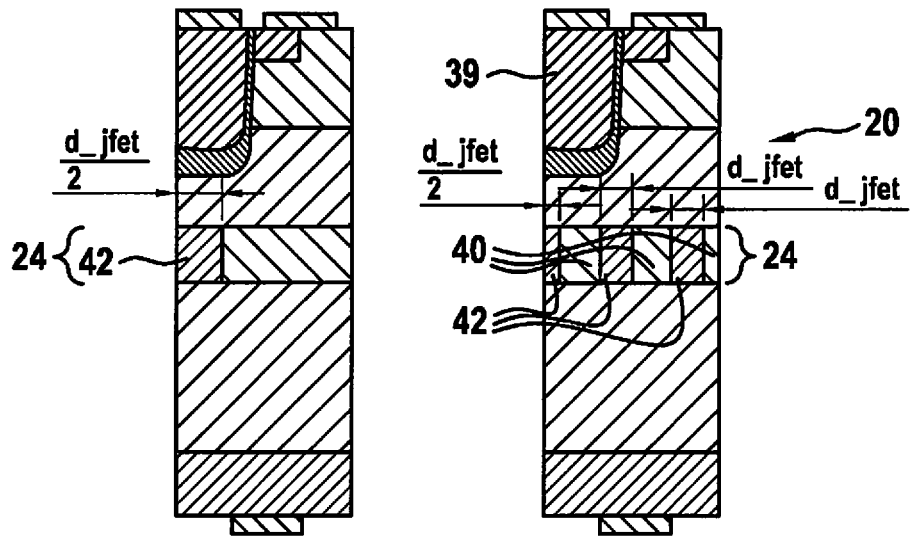
FIG. 15 shows two further embodiments of the MOSFET according to the present invention.

FIG. 15 shows two embodiments of MOSFET 20 according to the present invention, which differ only in terms of the structure of intermediate layer 24 and, in that context, in turn in terms of the spacing and number of n-doped regions 42 and p-doped regions 40 of intermediate layer 24. The left-hand portion of the Figure shows an example that has, for each MOS cell, only one n-doped region 42 in intermediate layer 24. The exemplifying embodiment depicted in the right-hand portion of the Figure, conversely, has five n-doped regions 42 for each unit cell; one of the regions is located centrally below gate trench 39, and only half of it is depicted because only a half-cell is shown. The p-doped regions 40 located between n-doped regions 42 are embodied to be somewhat wider than n-doped regions 40.

Figure 16:
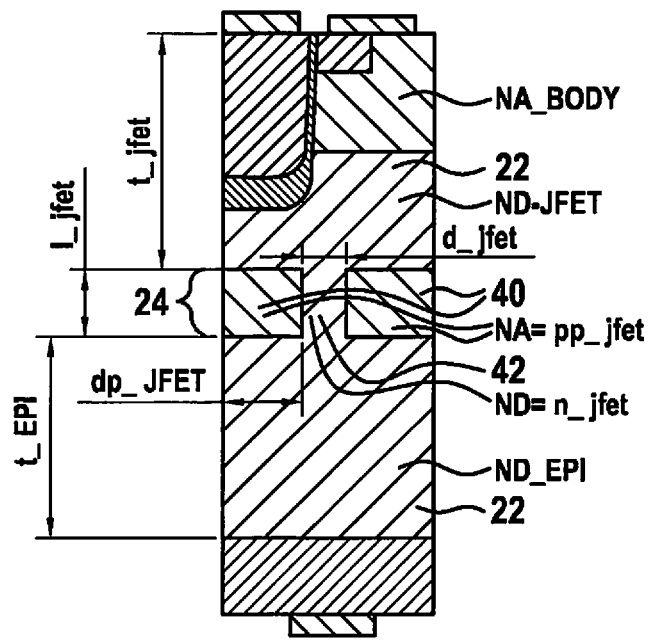
FIG. 16 shows a typical exemplifying embodiment of the invention.

FIG. 16 shows a typical exemplifying embodiment. All the important dimensions are illustrated once again in the Figure, and the reference characters already known from the other Figures apply.

Figure 17:
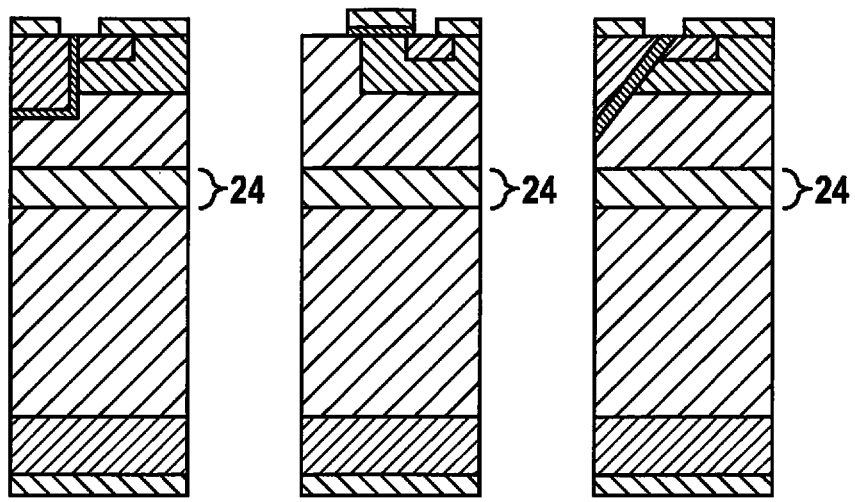
FIG. 17 shows the applicability of the concept to various transistor concepts.

FIG. 17 shows the applicability of the concept to various transistor concepts. The left-hand portion of the Figure shows integration into a trench MOSFET, as already known. A double-diffused metal oxide semiconductor (DMOS) field effect transistor, having an intermediate layer 24 according to the present invention, is evident in the center portion of the Figure. The right-hand portion of the Figure depicts a V-grooved MOS (VMOS) field effect transistor having an intermediate layer 24 according to the present invention.

Figure 18:
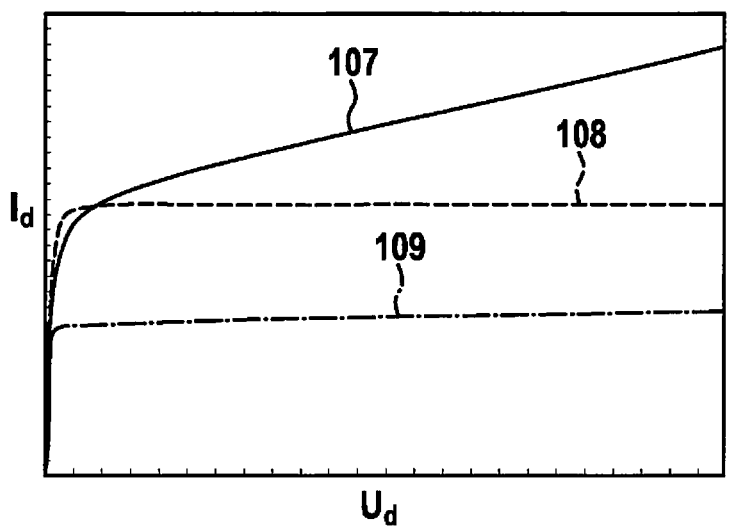
FIG. 18 shows output characteristic curves of exemplifying embodiments.

FIG. 18 shows output characteristic curves (107) of a conventional MOSFET as compared with two MOSFET's according to the present invention (108), (109). In a conventional MOSFET, a pronounced increase in saturation current with increasing drain voltage is evident. In the MOSFET according to the present invention, a sharp rise in current (i.e. good on-state resistance) is evident at low drain voltages. For higher drain voltages, a sharp transition occurs to an almost horizontal characteristic curve. The transition occurs once the drain voltage reaches the pinch voltage of the junction field effect transistor. The saturation current at high drain voltages, i.e. voltages above the transition voltage, can be set to different values depending on the embodiment and design, as is evident from a comparison of the two MOSFET characteristic curves according to the present invention. Advantageously, the location of the JFET pinch voltage is selected so that it is located well above typical on-state voltages with the MOSFET in the activated state, but usefully does not exceed 20% of the MOSFET's blocking voltage.

In all the exemplifying embodiments described, the signs of the dopings can of course be exchanged without deviating from the concept of the present invention. In other words, all the n-dopings that are described can be replaced with p-dopings, and vice versa.

What is claimed is:

1. A vertical SiC MOSFET, comprising:
   a source terminal;
   a drain terminal;
   a gate region;
   an epitaxial layer disposed between the source terminal and the drain terminal and having a doping of a first type; and
   a horizontally extending intermediate layer that is embedded into the epitaxial layer to divide the epitaxial layer into an upper region facing the source terminal and a lower region facing the drain terminal, wherein the intermediate layer includes second-doping-type regions having a doping of a second type different from the doping of the first type, the regions being embedded into the epitaxial layer, wherein at least the regions having doping of the second type are electrically conductively connected to the source terminal, wherein the upper region and the lower region have different doping concentrations, and properties of the MOSFET are adjusted by selecting the doping concentrations of the upper region and the lower region.

2. The vertical SiC MOSFET as recited in claim 1, wherein the intermediate layer includes first-doping-type regions and the second-doping-type regions.

3. The vertical SiC MOSFET as recited in claim 2, wherein:
   the first-doping-type regions of the intermediate layer are adjoined vertically at least one of in a direction of the source terminal and in a direction of the drain terminal by transition regions having a heavier doping of the first type as compared with the epitaxial layer, and
   the epitaxial layer is at least in part adjacent to the second-doping-type regions of the intermediate layer.

4. The vertical SiC MOSFET as recited in claim 2, wherein the first-doping-type regions of the intermediate layer include one of a double-funnel-shaped profile and an hourglass-shaped profile.

5. The vertical SiC MOSFET as recited in claim 1, wherein the second-doping-type regions are not completely cleared out when a voltage less than or equal to a blocking voltage of the SiC MOSFET is applied such that quasi-neutral areas are still present in the second-doping-type regions even after application of the blocking voltage.

6. The vertical SiC MOSFET as recited in claim 1, wherein the intermediate layer is disposed entirely below the gate region such that the intermediate layer is disposed vertically between the gate region and the drain terminal.

7. The vertical SiC MOSFET as recited in claim 1, wherein the intermediate layer and the epitaxial layer functionally constitute a junction field effect transistor.

8. The vertical SiC MOSFET as recited in claim 7, wherein a pinch voltage of the junction field effect transistor is in the range between 1 V and 50% of a breakdown voltage of the SiC MOSFET.

9. The vertical SiC MOSFET as recited in claim 7, wherein a channel of the junction field effect transistor and a channel of the MOSFET are disposed vertically one above another.

10. The vertical SiC MOSFET as recited in claim 7, wherein the junction field effect transistor is connected electrically in series with the MOSFET.

11. The vertical SiC MOSFET as recited in claim 1, further comprising:
 a transition layer having heavier doping of the first type as compared with the epitaxial layer, the transition layer vertically adjoining the intermediate layer in at least one of a direction of the source terminal and in a direction of the drain terminal.

12. The vertical SiC MOSFET as recited in claim 1, further comprising:
 a transition layer having heavier doping of the first type as compared with the epitaxial layer, the transition layer vertically adjoining the epitaxial layer in a direction of the source terminal.

13. The vertical SiC MOSFET as recited in claim 1, wherein the upper region, disposed between the source terminal and the intermediate layer, of the epitaxial layer has heavier doping of the first type than the lower region, disposed between the intermediate layer and the drain terminal, of the epitaxial layer.

14. The vertical SiC MOSFET as recited in claim 13, wherein the heavier doping of the first type that is heavier by a factor of 2 to 4.

15. A control device for a motor vehicle, comprising:
 a vertical SiC MOSFET, the MOSFET including:
  a source terminal;
  a drain terminal;
  a gate region;
  an epitaxial layer disposed between the source terminal and the drain terminal and having a doping of a first type; and
  a horizontally extending intermediate layer that is embedded into the epitaxial layer to divide the epitaxial layer into an upper region facing the source terminal and a lower region facing the drain terminal, wherein the intermediate layer includes second-doping-type regions having a doping of a second type different from the doping of the first type, the regions being embedded into the epitaxial layer, wherein at least the regions having doping of the second type are electrically conductively connected to the source terminal, wherein the upper region and the lower region have different doping concentrations, and properties of the MOSFET are adjusted by selecting the doping concentrations of the upper region and the lower region.

* * * * *